United States Patent [19]
Lu

[11] Patent Number: 5,870,004
[45] Date of Patent: Feb. 9, 1999

[54] TEMPERATURE COMPENSATED FREQUENCY GENERATING CIRCUIT

[75] Inventor: Hung-Pin Lu, Hsin-Chu, Taiwan

[73] Assignee: Utron Technology Inc., Hsinchu, Taiwan

[21] Appl. No.: 951,735

[22] Filed: Oct. 16, 1997

[51] Int. Cl.$^6$ .................................. H03B 5/04; H03B 5/24
[52] U.S. Cl. ............................ 331/176; 331/57; 331/143; 331/177 R
[58] Field of Search .................................. 331/57, 66, 111, 331/116 FE, 143, 176, 177 R, 186

[56] References Cited

U.S. PATENT DOCUMENTS 5,440,277  8/1995  Ewen et al. .............................. 331/176

Primary Examiner—David Mis
Attorney, Agent, or Firm—H. C. Lin

[57] ABSTRACT

The frequency of an integrated oscillator is held constant by using temperature compensation to compensate for the component variations due to temperature variations. A voltage controlled oscillator, which has temperature dependent components, is compensated with a temperature dependent control voltage. The frequency of many kinds of oscillators such as a relaxation oscillators and ring oscillators can be held constant when the operating current is held constant. The operating current is often derived from a current source, which is a voltage to current converter with a current equal to the ratio of a control voltage to a resistance. Since semiconductor resistance has a positive temperature coefficient is used to obtain a temperature invariant current source. The positive temperature coefficient is obtained with the difference junction voltage of two forward-biased pn junction voltages. The magnitude can be controlled by junction areas of the two junctions. The magnitude can also be amplified.

21 Claims, 4 Drawing Sheets

TEMPERATURE COMPENSATED FREQUENCY GENERATING CIRCUIT

This invention relates to a frequency generator, in particular to a clock generator for integrated circuits.

Multiple frequency processing system is becoming more popular in recent VLSI system applications. In such applications, an external clock source is usually used as a source to generate all the required signal frequencies. An external clock source requires a crystal oscillator, increases the integrated circuit (IC) pin count, and increase the layout area of the printed circuit board (PCB), on which the external source occupies. From a system standpoint, the external source impairs the clock signal integrity and high frequency operation due to increased stray capacitance. The increased wiring may also introduce high frequency radiation and cross-talk. Thus, the use of external clock source not only increases the system cost but also down grade the system performance such as speed and electromagnetic inference, etc.

During the past few years, the personal computer (PC) boosts up its performance power by increasing the processing speed and accuracy of the PC motherboard. The traditional clock timing source of the mother board are provided by a phase-locked loop (PLL), clock generator integrated circuit (IC). Typically, the source adopts a 14.318 MHz crystal oscillator as its timing reference. Because this crystal oscillator must lie beside the PLL clock chip, it occupies an area in the layout of a printed circuit board and radiates electromagnetic waves which increase the interference and cross-talk of signal processing.

While it is desirable to use an oscillator such as a relaxation oscillator or a ring oscillator, integrated with the IC for the system, it is difficult to maintain a stable frequency which is insensitive to temperature variations, because as temperature changes the component values or the operating currents may vary. Although it is possible to use a bandgap voltage reference to obtain a constant voltage which is independent of temperature variations, the circuit components, in particular the semiconductor resistance, cannot be made temperature invariant.

SUMMARY

An object of the present invention is not to use an external crystal to save IC area and PCB area. Another object of the present invention is to compensate for the temperature variation of component values in an IC. Still another object of the present invention is to reduce electromagnetic interference (EMI) of the PC system and to increase the integrity of the motherboard. A further object of the present is to enhance the stability ard reliability of a PC system.

These objects are achieved by using an independent frequency generating circuiit built inside the IC. A voltage supply with a temperature dependent output voltage is used to control a voltage-controlled oscillator so as to maintain a constant frequency. The power supply connects a positive temperature coefficient voltage in series with a negative temperature coefficient voltage. The negative temperature coefficient voltage is obtained from forward biased PN junctions. The positive temperature coefficient is obtained by taking the difference between two forward biased junction voltages operating at two different current densities. When the positive temperature coefficient voltage exceeds the negative temperature coefficient voltage, the control voltage has a positive temperature coefficient, and vice versa.

A programmable voltage buffer (or unity gain voltage buffer) provides an adjustable control of the reference voltage. A voltage-controlled oscillator (VCO) generates the corresponding frequency output according to the control voltage input.

The oscillator may be a relaxation oscillator, a ring oscillator or any other type suitable for integrated circuits. The operating currents are held constant by compensating the positive temperature coefficient of the resistance used in the current source with control voltage which has the same temperature coefficient.

DETAILED DESCRIPTION OF THE PREFERRED EMBODIMENT

Figure 1A:
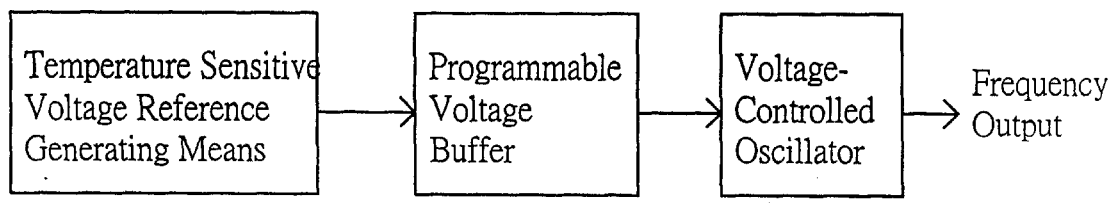
FIG. 1a shows the block diagram of the independent frequency generating circuit of the present invention, using a programmable voltage buffer.
Figure 1B:
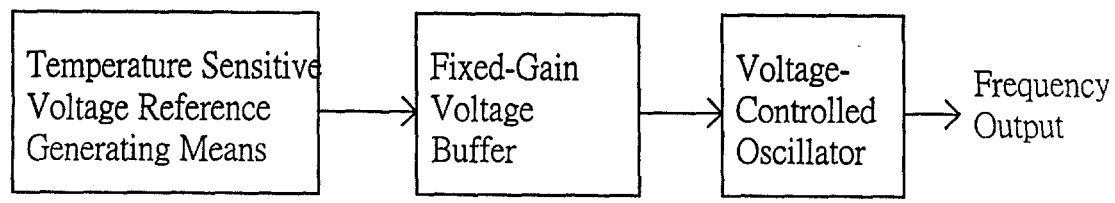
FIG. 1b shows the block diagram using a fixed gain voltage buffer.

FIGS. 1a and 1b show the block diagrams of an independent frequency generating circuit of the present invention. A voltage control oscillator is controlled by a reference voltage with a desired temperature coefficient to obtain a frequency which is insensitive to temperature variations.

Figure 2:
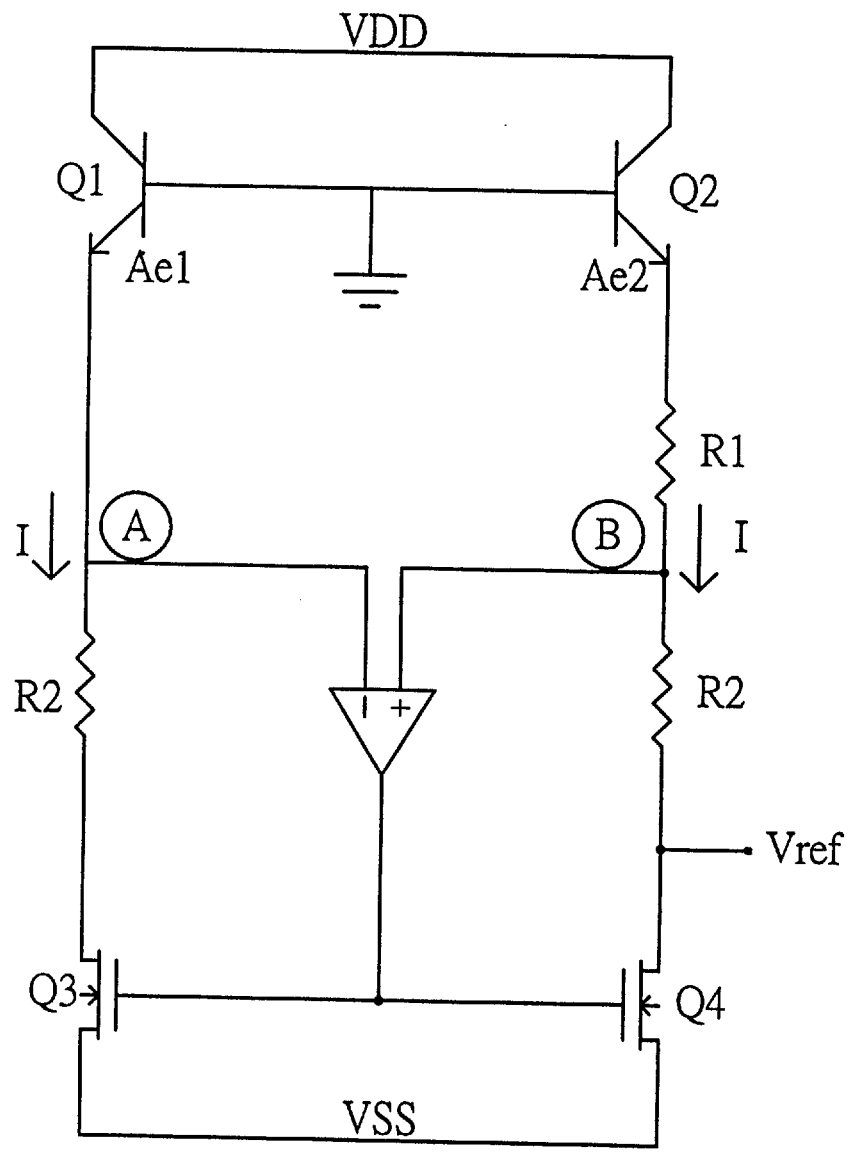
FIG. 2 shows a power supply with variable temperature coefficient.

FIG. 2 show the circuit of a variable temperature coefficient voltage supply. Two identical MOSFETs Q3 and Q4 have their source electrodes connected to a negative power supply Vss and their gates connected to the output of an operational amplifier OP. The drain of Q3 is connected through resistance R2 to the inverting input A of OP and the emitter of a bipolar transistor (BJT) Q1. The drain of Q4 is connected through another resistance R2 to the noninverting input B of OP, which is connected through resistance R1 to the emitter of BJT Q2. The bases of Q1 and Q2 are connected to ground and the collectors are connected to a positive power supply VDD.

With Q4 serving as an inverter and R2+R1+emitter junction of Q2 as a load, a negative feedback voltage is developed at the non-inverting input B. Since virtual ground requirement of an operational amplifier dictates that voltage at A and B be the same, the drain currents of both Q3 and Q4 must be the same and equal to I. The emitter area Ae2 of Q2 is A times larger than the emitter area Ae1 of Q1. Let the base emitter junction voltage drops of Q1 and Q2 be Vbe1 and Vbe2 respectively. Then the voltage drop IR1 equals the difference Vbe1−Vbe2, i.e.

$$I = (Vbe1 - Vbe2)/R1 \qquad (1)$$

and the output voltage Vref is:

$$Vref = -Vbe1 - (Vbe1 - Vbe2)R2/R1 \qquad (2)$$

The emitter current of a BJT is given as:

$$Ie = AeJo[exp.(q\,Vbe/kT) - 1] \qquad (3)$$

where Jo is the saturation current density and is proportional to $T^{-2.3}qVg/kT$ q is the electron charge=$1.6 \times 10^{-19}$ coulumbs k is the Boltzmann's constant=$1.38 \times 10^{-23}$ J/°K T is the absolute temperature in °K For constant emitter current of Q1 at different temperatures, differentiate equation (3) with respect to temperature and set it to zero, yielding the required variation of ΔVbe1 for a change of temperature ΔT:

$$\Delta Vbe1/\Delta T = -2m \ V/°K \qquad (4)$$

At any temperature T higher than a reference temperature To, the corresponding Vbe1 (T) is:

$$Vbe1(T) = Vbe1(To) - 0.002(T-To) \qquad (5)$$

Therefore Vbe1 has a negative temperature coefficient.

On the other hand, from equations (1) and (2), $$\begin{aligned} IR1 &= (Vbe1 - Vbe2) \\ &= (kT/q)[\ln(I/Ae1) - \ln(I/Ae2)] \\ &= (kT/q)\ln A \end{aligned} \qquad (6)$$

Thus, the current $I=[(kT/q)\ln A]/R1$ is proportional to T. The voltage drop across R2 then has a positive temperature coefficient.

$$IR2 = (R2/R1)(kT/q)\ln A \qquad (7)$$

The reference voltage becomes:

$$Vref(T) = -[Vbe1(To) - 0.002(T-To)] - [(R2/R1)(k/q)(\ln A)(T-To)] \qquad (8)$$

Since the first bracketed term on the right hand side has a negative temperature coefficient and the second bracketed term on the right hand side has a positive temperature coefficient, the reference voltage Vref (T) may have either a net positive temperature coefficient or a negative temperature coefficient by adjusting the resistance ratio (R2/R1) and/or adjusting the emitter area ratio A.

In many types of oscillators, the frequency is dependent of the operating current. For a relaxation oscillator, the frequency is dependent of the charging and discharging current of a capacitor. For a ring oscillator, the frequency is dependent on the delay time of an inverter which in turn is a function of the dc current. For such oscillators, the operating currents should be held constant when temperature varies. If these currents are derived from a current source, it is important that the current from a current source is stable over a range of operating temperature.

Figure 3:
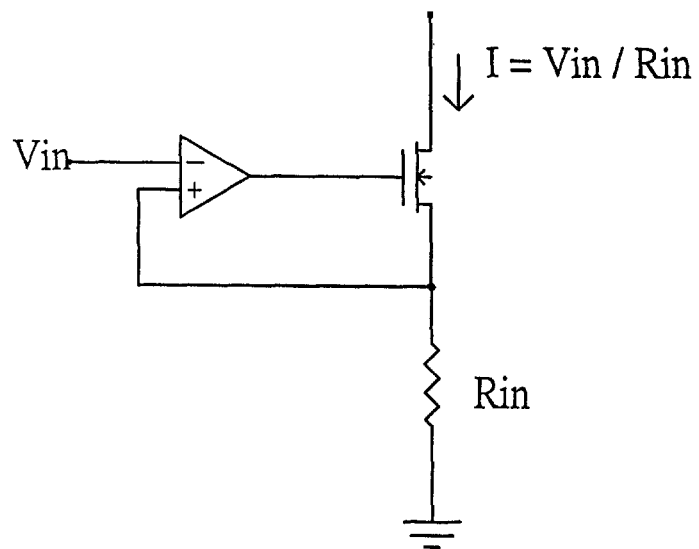
FIG. 3 shows a voltage to current converter as a current source.

FIG. 3 shows a commonly used current source, i.e. a voltage to current converter. A control voltage Vin is applied to the non-inverting input of an operational amplifier OP1. The output of OP1 is connected to the gate of an MOSFET M3 and the inverting input of OP1 which is connected through a resistance Rin to ground. Because of equal virtual ground potential of the two inputs, the current I through Rin is equal to Vin/Rin, which is equal to the drain current of M3. The drain current constitutes a current source.

Figure 4:
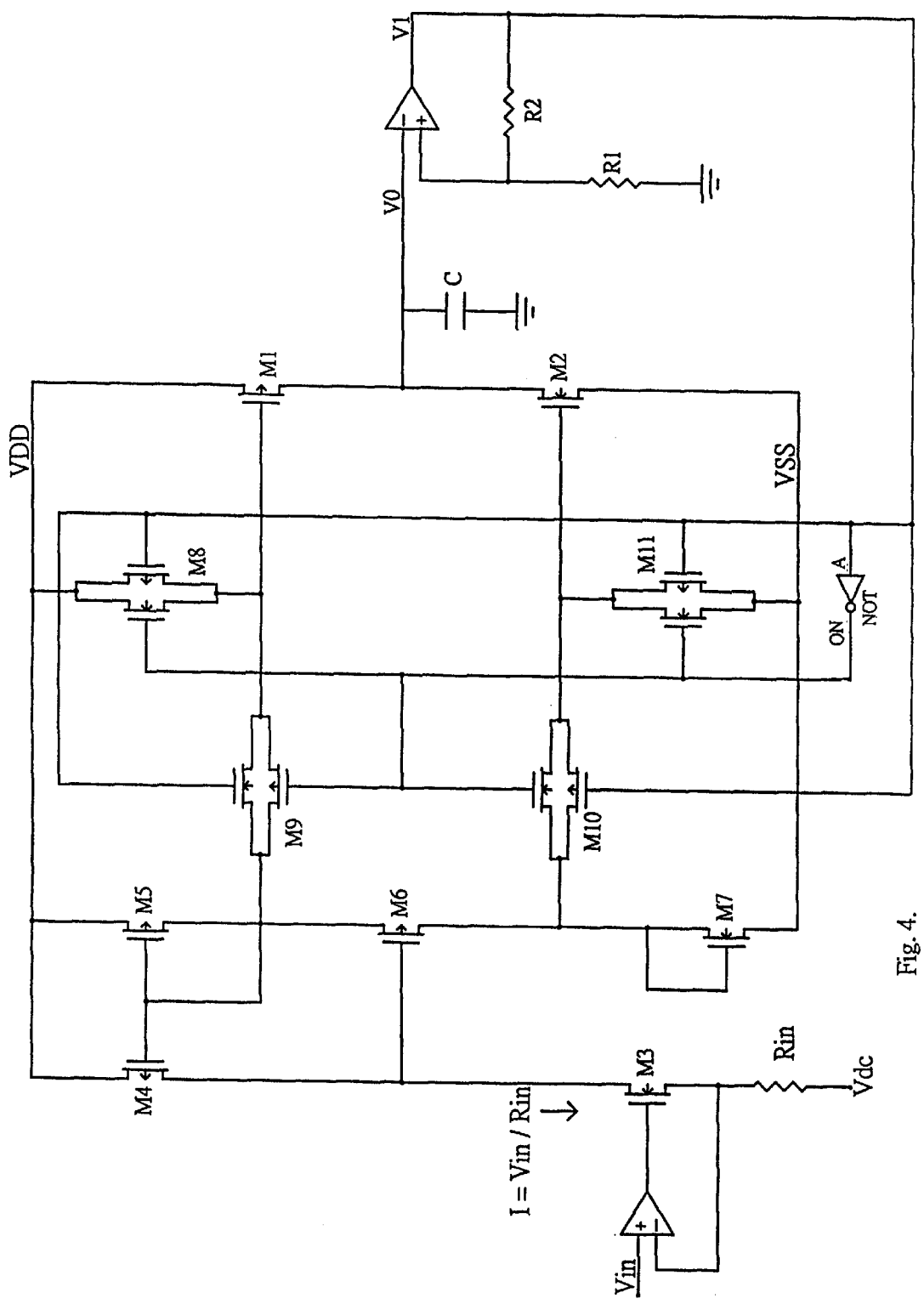
FIG. 4 shows a voltage-controlled relaxation oscillator.

FIG. 4 shows a typical VCO, which is of relaxation type. The operational amplifier OP2 with positive feedback from the voltage divider R2, R1 to form a Schmitt trigger generates a square wave by charging and discharging the capacitor C at the inverting input. This current is mirrored from a current source I comprising an operation amplifier OP1, a resistance Rin and a MOSFET M3 to constitute a voltage to current converter as shown in FIG. 3. The crain current I is mirrored through mirrors M4, M5 to MOSFET M1 for charging C when V1 is high and transmission gates M9, M11 are closed and transmission gates M8, M10 are open. This current I is mirrored to MOSFET M2 through a mirror M7 for discharging the capacitor C. (MOSFET M6 is used to clamp the drains of M3 and M4 in the drain current saturation regions.) When the output voltage V1 is positive, V1 switches state when the voltage Vc across the capacitor C reaches a threshold voltage of the Schmitt trigger. The charging time and the discharging time constitute a period of the oscillator and is inversely proportional the current I. For constant frequency, the current I must be held constant.

The current I is equal to Vin/Rin. In an integrated circuit, the resistance Rin is made of semiconductor which has a positive temperature coefficient. Let Rin at a temperature T be $$Rin(T) = Rin(To)[1 + \alpha(T-To)]. \qquad (9)$$

Then if the reference voltage as expressed in equation (8) is made equal to $$Vref(T) = Vbe(To)[1 + \alpha(T-To)] \qquad (10)$$

The condition for maintaining current I(T)=Vref(T)/Rin(T) to be constant can be derived from (9) and (10), $$\alpha = [(k/q)(R2/R1)(\ln A) - 0.002]/Vbe1(To) \qquad (11)$$

By adjusting the resistance ratio R2/R1, A and/or Vbe1(To) a temperature invariant current can be obtained.

The Vref(T) can be amplified or attenuated to obtain a suitable control voltage for the VCO.

Figure 5:
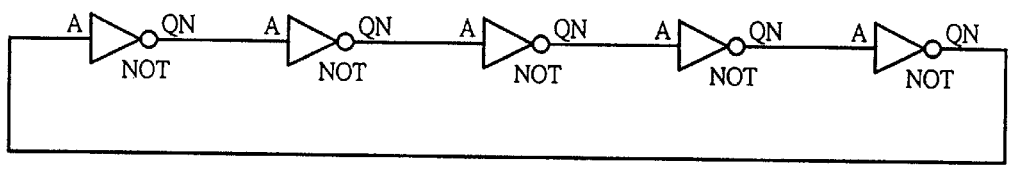
FIG. 5 shows a ring oscillator.

FIG. 5 shows the basic schematic diagram of a ring oscillator with N odd-number inverters connected in cascade. The oscillator frequency fosc is equal to:

$$fosc = 1/(2N\tau inv)$$

where τinv is the inverter delay per stage and is inversely proportional to the transconductance gm of the transistors. The gm is in turn proportional to the square root of the dc drain current. Thus if the inverters are fed from a constant current source similar to that shown in FIG. 3, the oscillating frequency can be held constant.

Figure 6A:
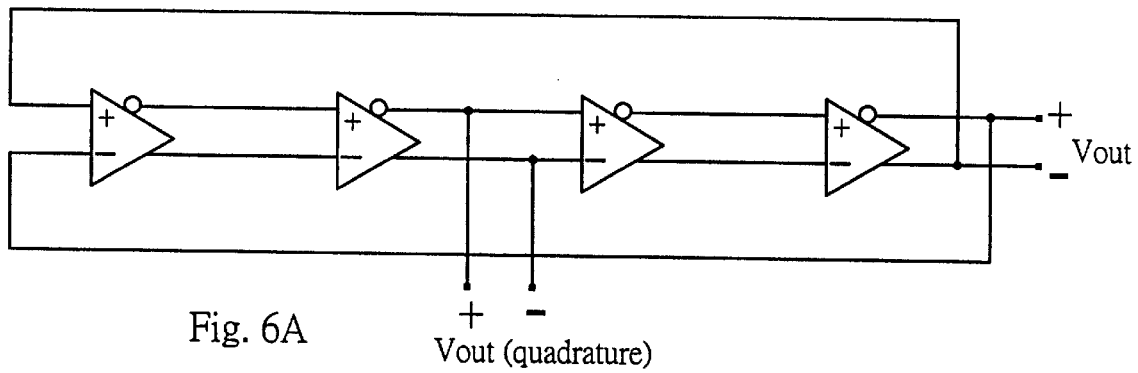
FIG. 6a shows a voltage controlled ring oscillator.
Figure 6B:
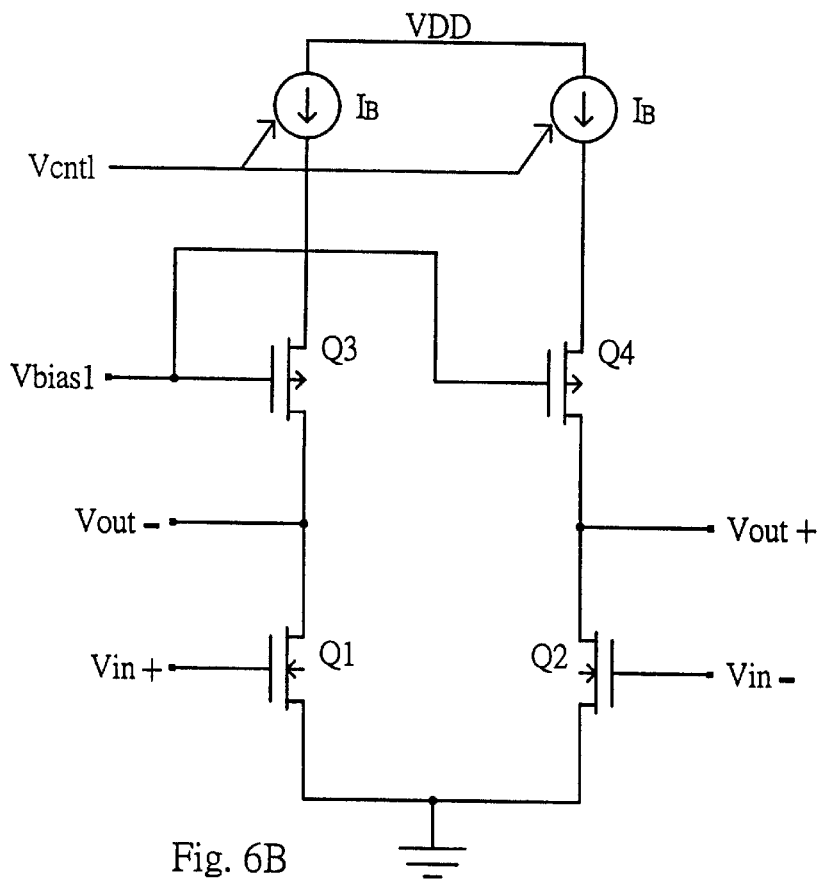
FIG. 6b shows the current source for the for the ring oscillator.

FIG. 6a shows such a voltage control ring oscillator, using differential inverters. FIG. 6b shows the inverters with a current source IB. The current sources IB can be controlled and held constant at different temperatures just as in the case of the relaxation oscillator described earlier by using a temperature compensation.

The output voltage from a programmable voltage buffer or unity-gain voltage buffer is used to generate a control voltage to control the voltage controlled oscillator (VCO), as shown in FIG. 1a and FIG. 1b respectively. The VCO generates the correlated frequency output according to the control voltage output. The programmable voltage buffer allows the system to readjust its operating frequency internally for optimal performance. In a PC system, the main task is executed in the Central Processing Unit (CPU) and the Cache RAM. The Basic Input Output System (BIOS) can control the programmable voltage buffer to increase the operating frequency for best performance. On the other hand, if the system performs mostly peripheral Input/Output task, the BIOS can lower the system frequency with the programmable voltage buffer for better stability and reliability. Otherwise) the CPU may overheat. Slowing down the operating speed of the CPU can cool down the CPU and improve the system reliability.

The design can further utilize fuse-trimming to trim the R2/R1 ratio to achieve greater accuracy. The VCO can be a conventional one such as a ring oscillator, relaxation oscillator, . . . etc. depending on the system requirement. It can be designed to meet the system application requirement.

While the foregoing descriptions apply to a relaxation oscillator and a ring oscilia or, the temperature compensation technique is not limited to these two types of oscillators. The technique is applicable to any circuits requiring a positive or negative temperature coefficient for compensation. The technique can be used wherever a temperature invariant current source is needed.

What is claimed is:

1. A temperature compensated constant frequency generator comprising:
   a voltage controlled oscillator (VCO) generator having a frequency controlled by a control voltage which varies with temperature to compensate for the temperature dependency of said frequency to obtain a temperature compensated frequency,
   means to derive said control voltage by connecting a first forward-biased pn junction voltage which has a negative temperature coefficient in series with a voltage difference of two forward-biased pn junctions, said voltage difference having a positive temperature coefficient.

2. A temperature compensated constant frequency generator as described in claim 1, wherein the magnitude of the positive temperature coefficient is greater than the magnitude of the negative temperature coefficient to obtain a net positive temperature coefficient.

3. A temperature compensated constant frequency generator as described in claim 1, wherein the magnitude of the positive temperature coefficient is adjusted by using different junction areas for said two forward biased pn junctions.

4. A temperature compensated constant frequency generator as described in claim 2, wherein said frequency generator is a voltage-controlled relaxation oscillator.

5. A temperature compensated constant frequency generator as described in claim 4, wherein the frequency of the generator is determined by the charging and discharging time of a capacitor.

6. A temperature compensated constant frequency generator as described in claim 5, wherein the current for charging and discharging said capacitor is kept constant with varying temperature.

7. A temperature compensated constant frequency generator as described in claim 6, wherein said current is derived from current source which is temperature compensated.

8. A temperature compensated constant frequency generator as described in claim 7, wherein said current source is a voltage to current converter comprising an operational amplifier driving the gate of an MOSFET,
   said operational amplifier having an inverting input connected to the source of said MOSFET and to ground through a semiconductor resistance which has a positive temperature coefficient, and
   a non-inverting input connected to said control voltage with positive temperature coefficient such that the drain of said MOSFET delivers a constant current at different temperatures.

9. A temperature compensated constant frequency generator as described in claim 1, wherein said pn junctions are emitter junctions of two bipolar transistors with common base connected to a fixed potential, and said difference of two junction voltages derived from a voltage developed across a first resistance connected between the emitter of one of the two bipolar transistors with a lower current density and the emitter of another of the two bipolar transistors with a higher current density.

10. A temperature compensated constant frequency generator as described in claim 9, wherein the current flowing through said first resistance also flows throuigh a second resistance to develop a voltage across said second resistance proportional to said difference voltage and having said positive temperature coefficient.

11. A temperature compensated constant frequency generator as described in claim 10, wherein said voltage developed across said second resistance is connected with the emitter junction voltage of the BJT with the higher density to obtain said control voltage.

12. A temperature compensated constant frequency generator as described in claim 11, wherein said positive temperature coefficient is increased by increasing the ratio of said second resistance to said first resistance.

13. A temperature compensated constant frequency generator as described in claim 6, wherein said generator is a voltage-controlled ring oscillator with odd number inverters are connected in cascade in a ring and each one of said inverters is fed with said current source.

14. A temperature compensated constant frequency generator as described in claim 13, wherein said inverters are differential inverters.

15. A temperature compensated constant frequency generator as described in claim 13, wherein each one of said inverters is a pair of complementary MOSFETs connected in series.

16. A temperature compensated constant frequency generator as described in claim 1, wherein a programmable voltage buffer is used to support flexible control of said control voltage.

17. A temperature compensated constant frequency generator as described in claim 1, further comprises a programmable voltage buffer as a supply voltage to said VCO as an adjustable control voltage.

18. A temperature compensated constant frequency generator as described in claim 17, wherein said programmable voltage is temperature compensated.

19. A temperature compensated constant frequency generator as described in claim 1, further comprises a fixed-gain voltage buffer as a supply voltage to said VCO for fixed frequency requirement.

20. A temperature compensated constant frequency generator as described in claim 19, wherein said supply voltage is temperature compensated.

21. A temperature compensated constant frequency generator as described in claim 19, wherein said fixed gain is unity.

* * * * *